(12) United States Patent
Coppola et al.

(10) Patent No.: US 12,132,010 B2
(45) Date of Patent: Oct. 29, 2024

(54) METAL-COATED, POLYMER-ENCAPSULATED ELECTRONICS MODULES AND METHODS FOR MAKING THE SAME

(71) Applicant: GM GLOBAL TECHNOLOGY OPERATIONS LLC, Detroit, MI (US)

(72) Inventors: Anthony M. Coppola, Rochester Hills, MI (US); Seongchan Pack, West Bloomfield, MI (US); Ming Liu, Troy, MI (US)

(73) Assignee: GM Global Technology Operations LLC, Detroit, MI (US)

( * ) Notice: Subject to any disclaimer, the term of this patent is extended or adjusted under 35 U.S.C. 154(b) by 835 days.

(21) Appl. No.: 17/225,508

(22) Filed: Apr. 8, 2021

(65) Prior Publication Data

US 2022/0328427 A1 Oct. 13, 2022

(51) Int. Cl.
*H01L 23/00* (2006.01)
*B60K 1/04* (2019.01)
(Continued)

(52) U.S. Cl.
CPC .............. *H01L 23/564* (2013.01); *B60K 1/04* (2013.01); *H01L 23/473* (2013.01); *H01L 23/552* (2013.01); *H02M 7/003* (2013.01)

(58) Field of Classification Search
CPC ... H01L 23/564; H01L 23/473; H01L 23/552; H01L 21/52; H01L 21/56; H01L 21/565; H02M 7/003
See application file for complete search history.

(56) References Cited

U.S. PATENT DOCUMENTS 6,103,075 A    8/2000    Winsel et al.
6,448,632 B1    9/2002    Takiar et al.
(Continued)

OTHER PUBLICATIONS

Liu, Coppola, Sonta; "Electronic Power Module Assemblies and Control Logic With Direct-Cooling Heat Pipe Systems"; U.S. Appl. No. 16/710,772, filed Dec. 11, 2019.
(Continued)

*Primary Examiner* — Peniel M Gumedzoe
(74) *Attorney, Agent, or Firm* — Quinn IP Law (57) ABSTRACT

Presented are metal-coated, polymer-encapsulated power semiconductor modules, methods for making/using such power modules, and vehicles with traction power inverters containing such power modules. A power electronics assembly includes one or more power semiconductor modules packaged inside an assembly housing. Each power module includes a substrate, a semiconductor device mounted on the substrate, a polymeric encapsulant encasing therein the substrate and semiconductor device, and an electrical lead connected to the semiconductor device and projecting from the polymeric encapsulant. A metallic or ceramic coating is applied to select sections of the polymeric encapsulant's exposed exterior surface. The metallic/ceramic coating may be a single metallic layer that covers substantially all of the exposed surface area of the polymeric encapsulant's exterior surface. An optional hydrophobic polymer layer, passivated layer, and/or oxidized layer may cover the exterior surface of this metallic layer. Alternatively, another metallic layer or intercalated lamellar microstructures may cover the metallic layer.

20 Claims, 4 Drawing Sheets

(51) Int. Cl.
*H01L 21/56* (2006.01)
*H01L 23/473* (2006.01)
*H01L 23/552* (2006.01)
*H02M 7/00* (2006.01)

(56) References Cited

U.S. PATENT DOCUMENTS

| | | | |
|---|---|---|---|
| 6,639,385 | B2 | 10/2003 | Verbrugge et al. |
| 6,641,942 | B1 | 11/2003 | Rouillard et al. |
| 7,109,685 | B2 | 9/2006 | Tate, Jr. et al. |
| 7,324,902 | B2 | 1/2008 | Verbrugge et al. |
| 7,373,264 | B2 | 5/2008 | Verbrugge et al. |
| 7,612,532 | B2 | 11/2009 | Verbrugge |
| 7,768,233 | B2 | 8/2010 | Lin et al. |
| 7,928,690 | B2 | 4/2011 | Koch et al. |
| 8,035,986 | B2 | 10/2011 | Koetting et al. |
| 8,054,046 | B2 | 11/2011 | Lin et al. |
| 8,059,404 | B2 | 11/2011 | Miller et al. |
| 8,108,160 | B2 | 1/2012 | Liu et al. |
| 8,170,818 | B2 | 5/2012 | Lin et al. |
| 8,198,864 | B2 | 6/2012 | Koch et al. |
| 8,212,519 | B2 | 7/2012 | Koch et al. |
| 8,321,164 | B2 | 11/2012 | Liu et al. |
| 8,581,543 | B2 | 11/2013 | Koch et al. |
| 8,645,088 | B2 | 2/2014 | Schaefer et al. |
| 8,836,280 | B2 | 9/2014 | Koch et al. |
| 9,172,118 | B2 | 10/2015 | Marsh et al. |
| 9,176,194 | B2 | 11/2015 | Meisner et al. |
| 9,178,192 | B2 | 11/2015 | Payne |
| 9,337,484 | B2 | 5/2016 | Verbrugge et al. |
| 9,354,277 | B2 | 5/2016 | Lin et al. |
| 9,461,490 | B2 | 10/2016 | Ying |
| 9,513,338 | B2 | 12/2016 | Koch et al. |
| 10,923,287 | B1 | 2/2021 | Coppola et al. |
| 2004/0061138 | A1* | 4/2004 | Shinohara ............. H01L 25/115 257/E23.098 |
| 2007/0215316 | A1* | 9/2007 | Saito ................. H05K 7/20927 165/41 |
| 2011/0309838 | A1 | 12/2011 | Lin et al. |
| 2012/0015687 | A1* | 1/2012 | Yamada .................. H01L 24/97 257/659 |
| 2014/0297084 | A1 | 10/2014 | Meisner et al. |
| 2015/0017508 | A1 | 1/2015 | Khakhalev |
| 2015/0162571 | A1 | 6/2015 | Ogg et al. |
| 2015/0301116 | A1 | 10/2015 | Baker et al. |
| 2015/0318502 | A1 | 11/2015 | Kanai |
| 2016/0039419 | A1 | 2/2016 | Wampler et al. |
| 2016/0077160 | A1 | 3/2016 | Wampler, II et al. |
| 2016/0254562 | A1 | 9/2016 | Morris-Cohen et al. |
| 2016/0259011 | A1 | 9/2016 | Joe |
| 2016/0293991 | A1 | 10/2016 | Goeltz et al. |
| 2016/0336552 | A1 | 11/2016 | MacLean et al. |
| 2016/0372777 | A1 | 12/2016 | Buckley et al. |
| 2017/0077507 | A1 | 3/2017 | Harada et al. |
| 2018/0082925 | A1 | 3/2018 | Grassmann |
| 2018/0375132 | A1 | 12/2018 | Li et al. |
| 2019/0126770 | A1 | 5/2019 | Koch et al. |
| 2019/0157710 | A1 | 5/2019 | Makino et al. |
| 2019/0357386 | A1 | 11/2019 | Coppola et al. |

OTHER PUBLICATIONS

Liu, Coppola, Sonta; "Electronic Power Module Assemblies and Control Logic With Direct-Cooling Vapor Chamber Systems"; U.S. Appl. No. 16/724,998, filed Dec. 23, 2019.

Coppola, Fatemi, Grover Jr, Liu, Yen; "Power Module With Vascular Jet Impingement Cooling System"; U.S. Appl. No. 17/152,084, filed Jan. 19, 2021.

Coopola, Fatemi; Golm, Liu; "Package for Power Semiconductor Device and Method of Manufacturing the Same"; U.S. Appl. No. 17/078,690, filed Oct. 23, 2020.

* cited by examiner

METAL-COATED, POLYMER-ENCAPSULATED ELECTRONICS MODULES AND METHODS FOR MAKING THE SAME

INTRODUCTION

The present disclosure relates generally to polymer-encapsulated electronics. More specifically, aspects of this disclosure relate to polymer-encapsulated power semiconductor modules for high-voltage power inverters of electric-drive vehicles.

Current production motor vehicles, such as the modern-day automobile, are originally equipped with a powertrain that operates to propel the vehicle and power the vehicle's onboard electronics. In automotive applications, for example, the vehicle powertrain is generally typified by a prime mover that delivers driving torque through an automatic or manually shifted power transmission to the vehicle's final drive system (e.g., differential, axle shafts, road wheels, etc.). Automobiles have historically been powered by a reciprocating-piston type internal combustion engine (ICE) assembly due to its ready availability and relatively inexpensive cost, light weight, and overall efficiency. Such engines include compression-ignited (CI) diesel engines, spark-ignited (SI) gasoline engines, two, four, and six-stroke architectures, and rotary engines, as some non-limiting examples. Hybrid electric and full electric (collectively "electric-drive") vehicles, on the other hand, utilize alternative power sources to propel the vehicle and, thus, minimize or eliminate reliance on a fossil-fuel based engine for tractive power.

A full-electric vehicle (FEV)—colloquially labeled an "electric car"—is a type of electric-drive vehicle configuration that altogether omits the internal combustion engine and attendant peripheral components from the powertrain system, relying on a rechargeable energy storage system (RESS) and a traction motor for vehicle propulsion. The engine assembly, fuel supply system, and exhaust system of an ICE-based vehicle are replaced with a single or multiple traction motors, a traction battery pack, and battery cooling and charging hardware in a battery-based FEV. Hybrid electric vehicle (HEV) powertrains, in contrast, employ multiple sources of tractive power to propel the vehicle, most commonly operating an internal combustion engine assembly in conjunction with a battery-powered or fuel-cell-powered traction motor. Since hybrid-type, electric-drive vehicles are able to derive their power from sources other than the engine, HEV engines may be turned off, in whole or in part, while the vehicle is propelled by the electric motor(s).

High-voltage (HV) electrical systems govern the transfer of electricity between the traction motor(s) and a rechargeable traction battery pack that stores and supplies the requisite power for operating many hybrid and full-electric powertrains. Compared to the single cell of a standard 12-volt starting, lighting, and ignition (SLI) battery, contemporary traction battery packs group stacks of battery cells into individual battery modules that are electrically interconnected in series or parallel and mounted onto the vehicle chassis, e.g., by a battery pack housing or support tray. HV electric systems may employ a front-end DC-to-DC power converter that is electrically connected to the vehicle's traction battery pack(s) in order to increase the supply of voltage to an HV main DC bus and a DC-to-AC power inverter module (PIM). A high-frequency bulk capacitor may be arranged across the positive and negative terminals of the main DC bus to provide electrical stability and store supplemental electrical energy. A dedicated Electronic Battery Control Module (EBCM), through collaborative operation with a Powertrain Control Module (PCM) and each motor's power electronics package, governs operation of the battery pack(s) and traction motor(s).

Due to the fact that electric-drive vehicles employ a direct current (DC) power supply and an alternating current (AC) prime mover, a traction power inverter module (TPIM) is employed to convert the DC power output by the traction battery pack into AC power that is consumable by each multiphase motor. During a regenerative braking driving mode, the TPIM may operate in reverse, i.e., as an electrical converter, to convert AC power output via electromagnetic induction (EMI) from the motor(s) into DC power that is storable by the battery pack. The TPIM often contains a package of individual power modules, each of which includes an arrangement of semiconductor devices (also referred to as "semiconductor dies") carried on a substrate that provides electrical and heat transfer pathways for the semiconductor dies. Each semiconductor device may be a metal-oxide-semiconductor field-effect transistor (MOSFET) device, a semiconductor diode device, or an insulated-gate bipolar transistor (IGBT) device that operates as a power semiconductor switch within an oscillator circuit that filters, rectifies, and boosts the signal. In some power module designs, the semiconductor die may be sandwiched between two thermally conductive substrates (e.g., direct bonded copper (DBC) substrates) so that heat may be simultaneously removed from both sides of the semiconductor die.

SUMMARY

Presented herein are metal-coated, polymer-encapsulated electronic devices, methods for making and methods for using such electronic devices, and motor vehicles equipped with high-voltage traction power inverters containing metal-coated, polymer-encapsulated power semiconductor modules. To enhance moisture protection and electromagnetic shielding, for example, single or multilayer metallic coatings cover select surface areas of polymeric encapsulants that encase therein power semiconductor modules. In general, an electronics system employs active electronic components that are encapsulated within an electrically insulating polymer which is coated in a moisture-resistant metallic layer. The outermost exterior surfaces of the polymeric encapsulant and/or metal coating may be engineered to increase surface energy before coating, such as chemical etching (e.g., via acid) or plasma treatment for increased surface roughness. To improve corrosion resistance, the exterior surface of the metallic coating may be passivated with multiple oxidation layers. An optional hydrophobic polymer coating may be applied onto the outermost exterior surface of the metal coating. Densification processes, such as thermal impact spraying, powder molding, or laser pinning (e.g., if residual stress needed), may be applied to the metal coating containing intercalated lamellar structures in order to enhance the effect of physical barriers for moisture diffusion.

Attendant benefits for at least some of the disclosed concepts include metal-coated, polymer-encapsulated electronics modules with direct-contact heat transfer between the coolant fluid and the individual power modules for improved system thermal management. In addition, sealing via polymer encapsulation and adhesion offers a simplified module fabrication process for decreased manufacturing time and costs. Other attendant benefits may include improved electromagnetic shielding with increased electromagnetic shielding for improved system performance. Use of a metallic coating on the encapsulating polymer provides a moisture barrier and an EMI shield while also enabling the power module package to be submerged in a liquid coolant to provide direct cooling of the internal electronics. In at least some applications, disclosed power inverter assemblies are able to achieve an at least 20-25% increase in cooling capabilities with a concomitant 20-25% decrease in package volume, 20-25% reduction in mass, and 35-50% savings in costs as compared to commercially available TPIM designs.

Aspects of this disclosure are directed to metal-coated, polymer-encapsulated power semiconductor modules, TPIM assemblies employing such power modules, and HV electrical systems containing such power modules. By way of example, a representative power electronics assembly includes an assembly housing (e.g., formed as a one-piece structure from a dielectric polymer) and one or more power modules packaged in the assembly housing (e.g., in a stacked or side-by-side arrangement). Each power module is fabricated with a substrate (e.g., formed from epoxy and silica) and an array of semiconductor devices (e.g., transistor and diode dies) mounted on the substrate. The substrate and semiconductor device(s) are encased within a polymeric encapsulant (e.g., formed from an epoxy or silicone-based mold compound). One or more electrical leads are connected to the semiconductor device(s) (e.g., via traces on the substrate) and project transversely from the polymeric encapsulant through the assembly housing. A fluid-tight, corrosion resistant metallic and/or ceramic coating is applied onto select exposed sections of the polymeric encapsulant's exterior surface.

Additional aspects of this disclosure are directed to motor vehicles equipped with HV TPIMs containing any of the herein described metal-coated, polymer-encapsulated power semiconductor modules. As used herein, the terms "vehicle" and "motor vehicle" may be used interchangeably and synonymously to include any relevant vehicle platform, such as passenger vehicles (ICE, REV, FEV, fuel cell, fully and partially autonomous, etc.), commercial vehicles, industrial vehicles, tracked vehicles, off-road and all-terrain vehicles (ATV), motorcycles, farm equipment, watercraft, aircraft, e-bikes, e-scooters, etc. For non-automotive applications, disclosed concepts may be implemented for any logically relevant use, including stand-alone power stations and portable power packs, power grids ("grid-tied" inverters), photovoltaic systems, pumping equipment, machine tools, appliances, etc. In an example, an electric-drive vehicle includes a vehicle body with a passenger compartment, multiple road wheels mounted to the vehicle body, and other standard original equipment. One or more electric traction motors operate alone (e.g., for full electric powertrains) or in conjunction with an engine assembly (e.g., for hybrid electric powertrains) to selectively drive one or more of the road wheels to thereby propel the vehicle. An HV electrical system may operatively connect the traction motor(s) to a rechargeable energy storage system resident to the vehicle body.

Continuing with the discussion of the above example, the vehicle also includes a rechargeable traction battery pack that is mounted onto the vehicle body and operable to power the traction motor(s). One or more TPIMs connect the battery pack to the motor(s) and electrically invert power transferred therebetween. The TPIM contains one or more power module packages, each of which has multiple power modules packaged in a fluidly cooled assembly housing. Each power module includes a substrate with multiple semiconductor devices mounted on the substrate, and a polymeric encapsulant encasing therein the substrate and semiconductor devices. Low-voltage and high-voltage electrical leads are connected to the semiconductor devices and project out from the polymeric encapsulant and through the assembly housing. A multilayer metallic coating covers select sections of the polymeric encapsulant's exterior surface.

Other aspects of this disclosure are directed to manufacturing processes, control logic, and computer-readable media (CRM) for making or using any of the disclosed encapsulated devices, TPIMs, HV electrical systems, and/or vehicles. In an example, a method is presented for manufacturing a power electronics assembly. This representative method includes, in any order and in any combination with any of the above and below disclosed options and features: forming an assembly housing; assembling a power module including a substrate, a semiconductor device mounted on the substrate, and an electrical lead connected to the semiconductor device; encasing the substrate and the semiconductor device in a polymeric encapsulant; applying a metallic and/or ceramic coating on an exterior surface of the polymeric encapsulant; and locating the power module encased in the polymeric encapsulant with the metallic/ceramic coating in the assembly housing.

For any of the disclosed devices, systems, and methods, the metallic/ceramic coating includes, or consists essentially of, a single metallic layer that is mounted directly onto and covers substantially all of an exposed surface area of the polymeric encapsulant's exterior surface. For multilayer constructions, an optional hydrophobic polymer layer may cover the exterior surface of the metallic layer opposite that of the metallic layer's interior surface that adjoins the polymeric encapsulant. The exterior surface of the metallic layer may include an etched or roughened finish. As a further option, a passivated layer and/or an oxidized layer may be formed on some or all of the metallic layer's exterior surface.

For any of the disclosed devices, systems, and methods, the metallic/ceramic coating may include a supplemental (second) metallic layer that covers some or all of the primary (first) metallic layer that abuts the polymer encapsulant. These two layers may be formed from the same or similar metallic material or, alternatively, may each be formed with a distinct metallic material. In a non-limiting example, the primary (first) metallic layer may be formed, in whole or in part, from zinc, whereas the supplemental (second) metallic layer may be formed, in whole or in part, from steel. As yet a further option, an intercalated lamellar microstructure may be formed, e.g., via thermal spray or power metallurgy techniques, on the exterior surface of the primary (first) metallic layer. Each metallic layer may be formed via thermal spray techniques, electroplating, chemical "electroless" plating, anodizing, laser cladding, physical vapor deposition, chemical vapor deposition, etc.

For any of the disclosed devices, systems, and methods, the metallic/ceramic coating has a thickness of about 1 micrometer (μm) to about 500 μm. As another option, the assembly housing is formed, in whole or in part, from a first polymeric material, whereas the polymeric encapsulant is formed, in whole or in part, from a second polymeric material distinct from the first polymeric material. The first polymeric material may include an epoxy with silica, and the second polymeric material may include an epoxy-based and/or silicone-based mold compound. Rather than using a metal coating, the polymeric encapsulating may be coated in ceramic, silicates, phosphates, and/or hydroxylates.

For any of the disclosed devices, systems, and methods, the assembly housing includes an elongated body with an inlet port, an outlet port, and a coolant fluid channel that fluidly connects the inlet and outlet ports. This fluid channel may extend longitudinally through the housing body, interposed between an interior surface of the assembly housing's top or bottom half and a major surface of the power module. The power module may include one or more thermally conductive heat transfer plates, each of which is attached to the semiconductor device and defines a major surface of the power module. An array of heat transfer fins may be mounted onto each major surface of the power module and disposed within the fluid channel. Adhesive materials, such as epoxy, parylene, or silicone, may be used to bond each power module to the assembly housing.

The above summary does not represent every embodiment or every aspect of this disclosure. Rather, the above features and advantages, and other features and attendant advantages of this disclosure, will be readily apparent from the following detailed description of illustrative examples and modes for carrying out the present disclosure when taken in connection with the accompanying drawings and the appended claims. Moreover, this disclosure expressly includes any and all combinations and subcombinations of the elements and features described above and below.

Representative embodiments of this disclosure are shown by way of non-limiting example in the drawings and are described in additional detail below. It should be understood, however, that the novel aspects of this disclosure are not limited to the particular forms illustrated in the above-enumerated drawings. Rather, the disclosure is to cover all modifications, equivalents, combinations, subcombinations, permutations, groupings, and alternatives falling within the scope of this disclosure as encompassed, for instance, by the appended claims.

DETAILED DESCRIPTION

This disclosure is susceptible of embodiment in many different forms. Representative examples of the disclosure are shown in the drawings and herein described in detail with the understanding that these embodiments are provided as an exemplification of the disclosed principles, not limitations of the broad aspects of the disclosure. To that end, elements and limitations that are described, for example, in the Abstract, Introduction, Summary, Description of the Drawings, and Detailed Description sections, but not explicitly set forth in the claims, should not be incorporated into the claims, singly or collectively, by implication, inference, or otherwise. Moreover, the drawings discussed herein may not be to scale and are provided purely for instructional purposes. Thus, the specific and relative dimensions shown in the Figures are not to be construed as limiting.

For purposes of the present detailed description, unless specifically disclaimed: the singular includes the plural and vice versa; the words "and" and "or" shall be both conjunctive and disjunctive; the words "any" and "all" shall both mean "any and all"; and the words "including," "containing," "comprising," "having," and permutations thereof, shall each mean "including without limitation." Moreover, words of approximation, such as "about," "almost," "substantially," "generally," "approximately," and the like, may each be used herein in the sense of "at, near, or nearly at," or "within 0-5% of," or "within acceptable manufacturing tolerances," or any logical combination thereof, for example. Lastly, directional adjectives and adverbs, such as fore, aft, inboard, outboard, starboard, port, vertical, horizontal, upward, downward, front, back, left, right, etc., may be with respect to a motor vehicle, such as a forward driving direction of a motor vehicle, when the vehicle is operatively oriented on a horizontal driving surface.

Figure 1:
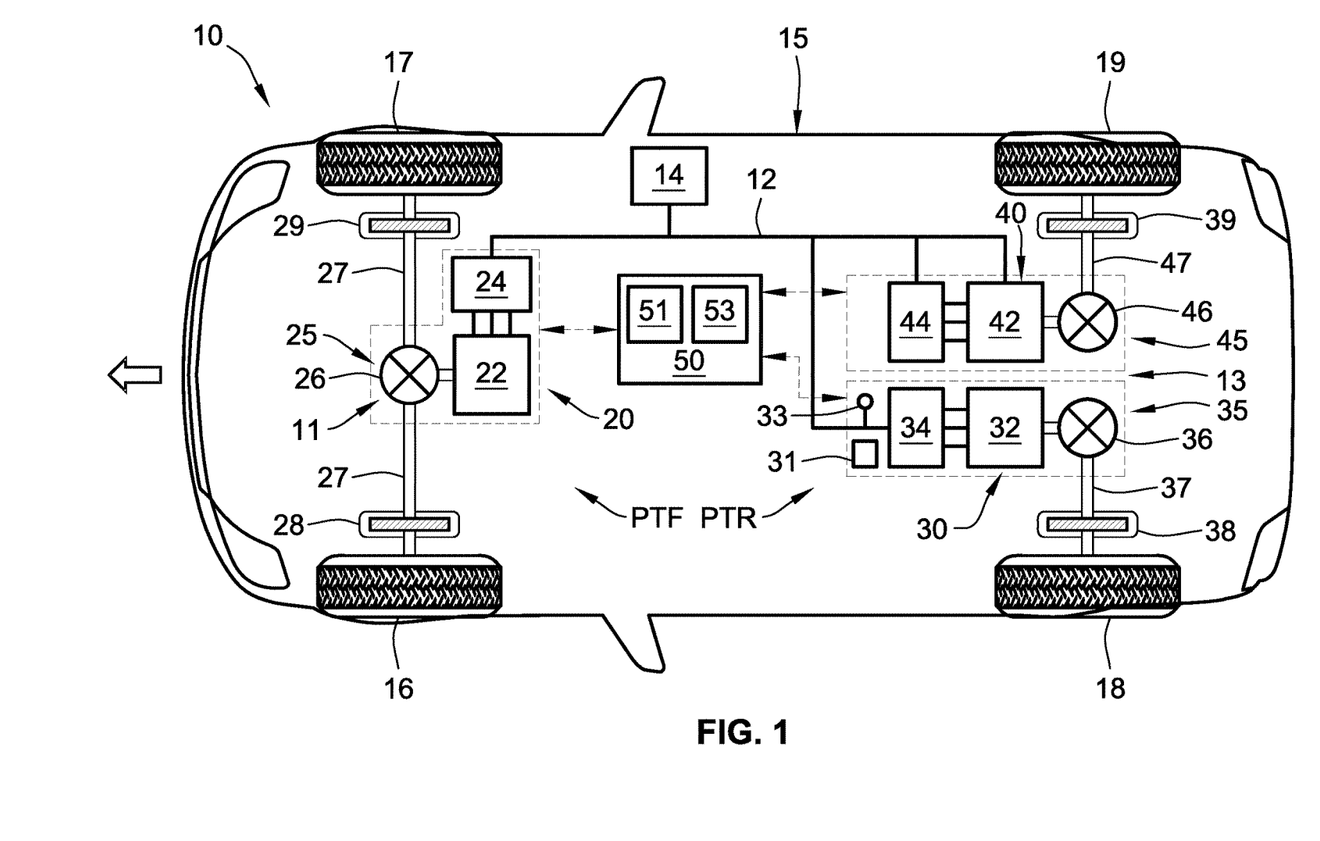
FIG. 1 is a schematic illustration of a representative electric-drive vehicle with a full-electric powertrain employing multiple motor/generator units (MGU) electrically connected to a rechargeable traction battery pack via individual traction power inverter modules (TPIM) in accord with aspects of the present disclosure.

Referring now to the drawings, wherein like reference numbers refer to like features throughout the several views, there is shown in FIG. 1 a schematic illustration of a representative automobile, which is designated generally at 10 and portrayed herein for purposes of discussion as a sedan-style, electric-drive passenger vehicle. The illustrated automobile 10—also referred to herein as "motor vehicle" or "vehicle" for short—is merely an exemplary application with which novel aspects of this disclosure may be practiced. In the same vein, incorporation of the present concepts into a full-electric AWD powertrain should also be appreciated as a non-limiting implementation of disclosed features. As such, it will be understood that aspects of this disclosure may be applied to other powertrain architectures, may be implemented for any logically relevant type of vehicle, and may be utilized for automotive and non-automotive applications alike. Moreover, only select components of the motor vehicles and power module packages are shown and described in additional detail herein. Nevertheless, the vehicles and power modules discussed below may include numerous additional and alternative features, and other available peripheral components, for carrying out the various methods and functions of this disclosure.

Electric-drive vehicle 10 of FIG. 1 is an example of a battery electric vehicle (BEV) equipped with a multi-mode, front-and-rear independent drive (FRID) powertrain that enables on-demand all-wheel drive capabilities by simultaneously transferring propulsion torque to multiple road wheels from independently operable electrified drive units (DU). The AWD BEV powertrain of automobile 10 is shown with a split-branch architecture: a front (primary) powertrain PTF branch at a forward end of the vehicle body 15 and a rear (auxiliary) powertrain PTR branch aft of the front powertrain PTF at a rearward end of the vehicle body 15. In this example, the front powertrain PTF may be typified by front (first) axle 11 for driving front-left (front passenger-side) and front-right (front driver-side) drive wheels 16 and 17. Likewise, the rear powertrain PTR may be typified by a rear (second) axle 13 driving rear-left (rear passenger-side) and rear-right (rear driver-side) wheels 18 and 19. Vehicle 10 of FIG. 1 is shown with at least one dual-independent drive unit (DIDU) axle on the rear axle 13; however, the electric-drive vehicle 10 may utilize multiple DIDU axles, a single DIDU axle on the front axle 11, etc.

To propel the vehicle 10 during either FWD or AWD operating modes, a first prime mover, which may be in the nature of a front (primary) drive unit 20, generates tractive torque for driving both of the front drive wheels 16, 17. Packaged within the front drive unit 20 is an electric traction motor 22 that is mechanically coupled to the front left and right wheels 16, 17 via a front (first) driveline 25. In accord with the illustrated example, the front driveline 25 utilizes an integrated transmission, differential and axle (transaxle) unit 26 with independent half-shafts 27 for coupling the motor 22 to the wheels 16, 17. A front (first) power inverter module (PIM) 24 electrically connects the drive unit motor 22 to a rechargeable energy storage system (RESS) 14. For a fully integrated drive unit assembly, the motor, inverter, and transmission of a DU 20, 30, 40 are packaged as a unitary construction with internal cooling and high specific power capabilities.

Operation of the front drive unit 20 and associated PIM 24 is provisioned by a resident vehicle controller 50, which may include a resident memory device 51 and one or more subsystem control modules 53, which may comprise any one or more of a Powertrain Control Module (PCM), an Advanced Driver Assistance System (ADAS) module, an Electronic Battery Control Module (EBCM), a Brake System Control Module (BSCM), etc. Front-left and front-right (disc, drum, or air) friction brakes 28 and 29, respectively, are selectively engaged to decelerate the front drive wheels 16, 17 in response to a braking command, e.g., from BSCM of vehicle controller 50. A high-voltage electrical bus 12 couples the vehicle's three drive units 20, 30, 40 to the RESS 14. In at least some implementations, the RESS 14 is configured as a multi-cell lithium-ion device capable of charging and discharging under a range of conditions. Although portrayed with a single prime mover embodied as a traction motor, the front powertrain PTF may employ multiple traction motors, an engine assembly, or a hybrid combination of an engine and a motor.

To propel the vehicle 10 during either AWD or, if available, RWD operating modes, second and third prime movers, which may be in the nature of a left-rear (first auxiliary) drive unit 30 and a right-rear (second auxiliary) drive unit 40, generate tractive torque for independently driving the rear drive wheels 18, 19. Packaged within the left-rear drive unit 30 is first auxiliary electric traction motor 32 that is mechanically coupled to the rear-left wheel 18 via a rear-left driveline 35. In the same vein, a second auxiliary electric traction motor 42 is packaged within the right-rear drive unit 40 and mechanically coupled to the rear-right wheel 19 via a rear-right driveline 45. The rear-left driveline 35 utilizes an independent differential unit 36 and dedicated rear half-shaft 37 for coupling the motor 32 to the rear-left drive wheel 18. Likewise, the rear-right driveline 45 utilizes its own independent differential unit 46 and dedicated rear half-shaft 47 for coupling the motor 42 to the rear-right drive wheel 19. For at least some desired applications, each traction motor 22, 32, 42 is a polyphase AC permanent magnet (PM) motor generator unit (MGU).

A rear-left (second) power inverter module 34 electrically connects the rear-left drive unit motor 32 to the RESS 14 via bus 12, and a rear-right (third) power inverter module 44 electrically connects the rear-right drive unit motor 42 to the RESS 14 via bus 12. Independent operation of the rear drive units 30, 40 and their respective PIMs 34, 44 may also be provisioned by the resident vehicle controller 50. Each PIM 24, 34, 44 is an element of the DU power electronics control (PEC) subsystem that regulates transmission of electrical energy to and from the traction motors 22, 32, 42 and, when desired, converts high-voltage DC power into three-phase AC power, and vice versa, as needed. A traction PIM may include a set of power inverters, high-speed transistors, and capacitor-based filters along with motor control hardware to receive motor control commands for providing motor drive and regeneration functionality. Rear-left and rear-right friction brakes 38 and 39, respectively, are selectively engaged to decelerate the rear-left and rear-right wheels 18, 19 in response to associated braking commands, e.g., from vehicle controller 50.

RESS 14 is adapted for storing and supplying high-voltage electrical energy used for propelling the electric-drive vehicle 10 of FIG. 1. This RESS may be a deep-cycle, high-ampere capacity battery system rated for approximately 350 to 800 VDC or more, for example, depending on a desired vehicle range, gross vehicle weight, and power ratings of the various accessory loads drawing electrical power from the RESS. To this end, the RESS may employ one or more high-voltage, high-energy-density battery packs that electrically connect to the drive unit motors. A traction battery pack is generally composed of an array of lithium-ion rechargeable (secondary) battery modules. These battery modules may be arranged in a pattern of rows and columns and may be buttressed on a battery support tray or packaged inside a battery pack housing. Aspects of the disclosed concepts may be similarly applicable to other electric storage unit architectures, including those employing nickel metal hydride (NiMH) batteries, lead acid batteries, lithium polymer batteries, or other applicable type of rechargeable electric vehicle battery (EVB). Each battery module may include a series of electrochemical battery cells, such as stacked pouch-type lithium ion (Li-ion) or Li-ion polymer battery cells, for example.

Discussed below are representative power electronics systems with active electronics components that are encapsulated within electrically insulating polymers that are covered in moisture-resistant metallic or ceramic coatings. In a power inverter package, for example, the delicate semiconductor electronics are encased within an encapsulating polymer for increased environmental protection and electrical isolation. Over the operational lifetime of the power electronics system, however, an uncoated polymeric encapsulant may deteriorate and eventually begin to absorb moisture. This absorbed moisture, in turn, may reduce the electrical performance of the assembly and may corrode the embedded electronics, potentially requiring repair or replacement. Some existing designs utilize metal cooling plates to allow the polymer-encapsulated electronics to be submerged in a cooling fluid. This approach, however, increases material and fabrication costs, packaging requirements, and overall mass of the system. Electromagnetic noise is also emitted by the device, which may need to be shielded to prevent interference with other systems.

To minimize the ingress of moisture into a power semiconductor module, a metallic coating and/or a ceramic coating may be applied onto the polymer encapsulant. Use of a metallic and/or ceramic coating on the polymer encapsulant acts a moisture barrier and an EMI shield while enabling the system to be submerged in a liquid coolant to provide direct cooling of the semiconductor devices. This metallic/ceramic layer may have a substantially uniform thickness of about 1 μm to about 500 μm. A predefined clearance (e.g., a gap of approximately 2-4 mm) may be maintained between the metallic coating and the module's high-voltage and low-voltage electrical leads to prevent shorting and electrical interference. A metal/ceramic coating may be applied to additional segments of the power module package to improve bonding of the power modules to a polymer assembly housing. Anti-permeation of moisture into an encapsulated power module may be achieved by application of a structurally engineered metal coating system, which alters surface properties, such as lowering surface energy and increasing surface roughness, and establishes physical barriers to reduce diffusion coefficients of absorbed molecules.

Figure 2:
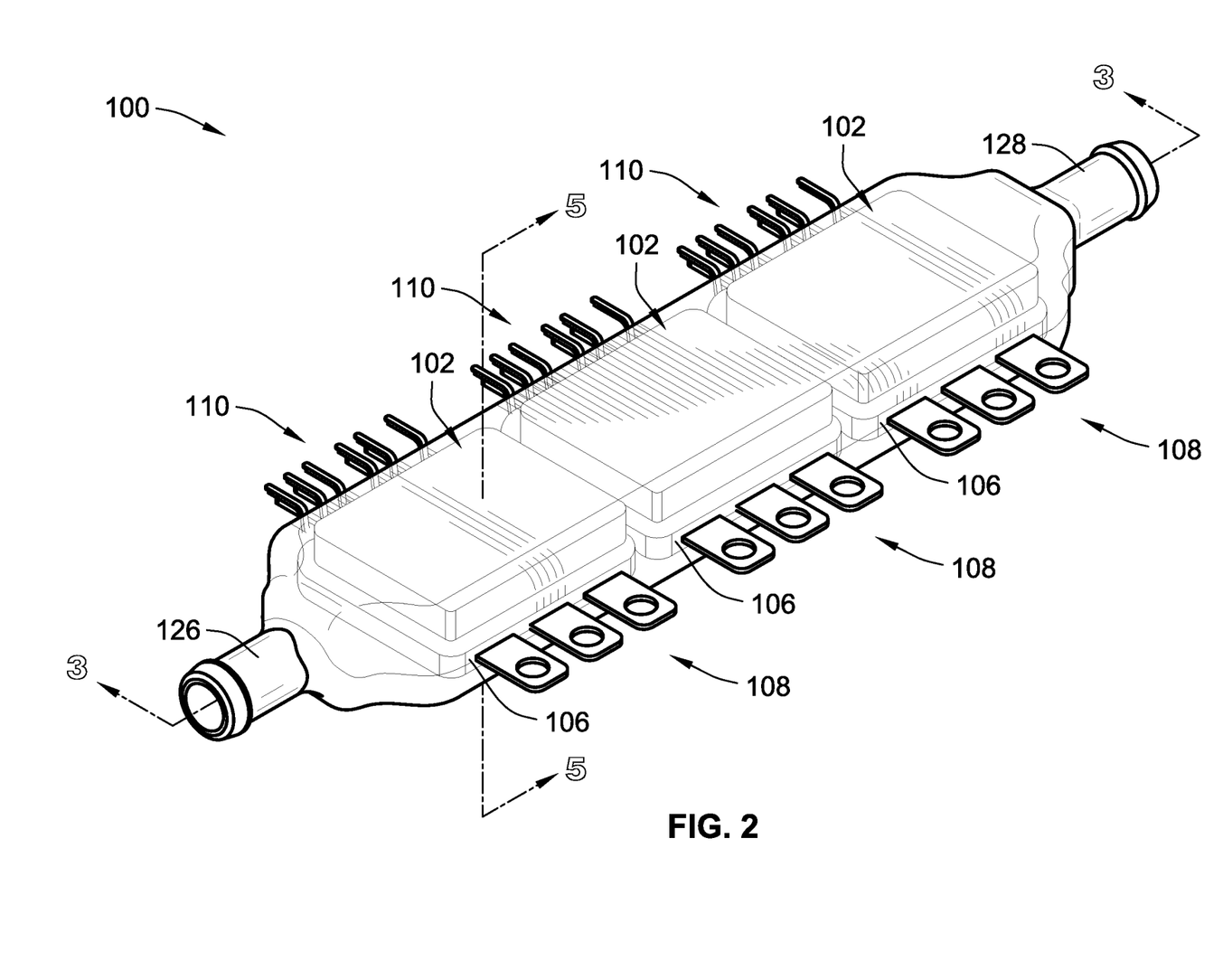
FIG. 2 is a perspective-view illustration of a representative TPIM power module package containing multiple metal-coated, polymer-encapsulated power semiconductor modules in accordance with aspects of the present disclosure.

FIG. 2 illustrates a power module package 100 that is representative of a portion of an electronics system that employs a metal-coated, polymer-encapsulated electronics device to modify the transmission of electrical power between a source and a load. In an electrified powertrain application, such as automobile 10 of FIG. 1 for example, two such power module packages 100 may operate in unison as a switch network of a three-phase electrical circuit to provision direct current-to-alternating current (DC/AC) inverter functionality, such as within PIMs 24, 34, 44 of FIG. 1. The power module package 100 of FIG. 2 is generally composed of three power semiconductor modules ("power modules") 102 that are packaged inside a protective assembly housing 104. For ease of manufacture and simplicity of design, the power modules 102 may be substantially identical with one another, notwithstanding innate manufacturing variances and tolerances. While portrayed as consisting of three power modules 102 aligned side-by-side in a single row, the power module package 100 may comprise greater or fewer power modules 102, which may be similar to or distinct from one another and may be packaged in alternative arrangements, e.g., spaced equidistantly in a stacked or circular arrangement.

Figure 5:
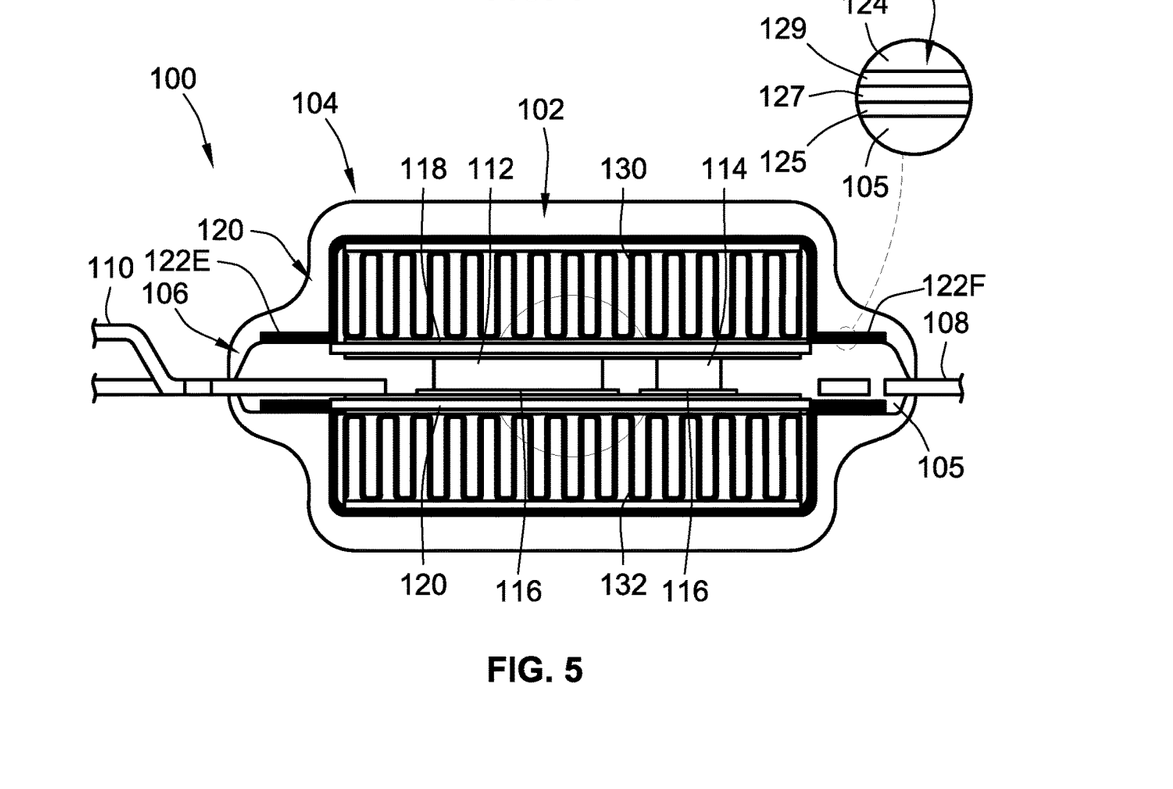
FIG. 5 is transverse cross-section of the representative TPIM power module package taken along line 5-5 of FIG. 2.

As best seen in FIGS. 2 and 5, each power module 102 is fabricated with a module body 106 and a plurality of electrical connectors—three high-voltage leads 108 and three low-voltage leads 110—extending transversely from opposite sides of the module body 106. Encased within the power module body 106 are a first set of semiconductor devices 112, a second set of semiconductor devices 114, and a substrate 116 supporting thereon and operatively connecting the semiconductor devices 112, 114. The first set of semiconductor devices 112 may include two or four IGBT dies, MOSFET dies, and/or thyristor dies. The second set of semiconductor devices 114 may include two or four large-signal or silicon-controlled rectifier diode dies. In a three-phase circuit switch network of a PIM, three pairs of series switches may be arranged with diodes antiparallel to each switch to correspond to the three phases of a polyphase motor. Each pair of series switches may comprise a first transistor switch (e.g., a "high switch") having a respective lead coupled to a positive electrode of a voltage source (e.g., battery pack within RESS 14) and a second transistor switch (e.g., a "low switch") having a respective lead coupled to a negative electrode of the voltage source. The substrate 116 may be fabricated, in whole or in part, from dielectric material, such as epoxy and silica, and may employ molybdenum spacers for selective electrical isolation and silver sintering paste for electrical connections.

Figure 4:
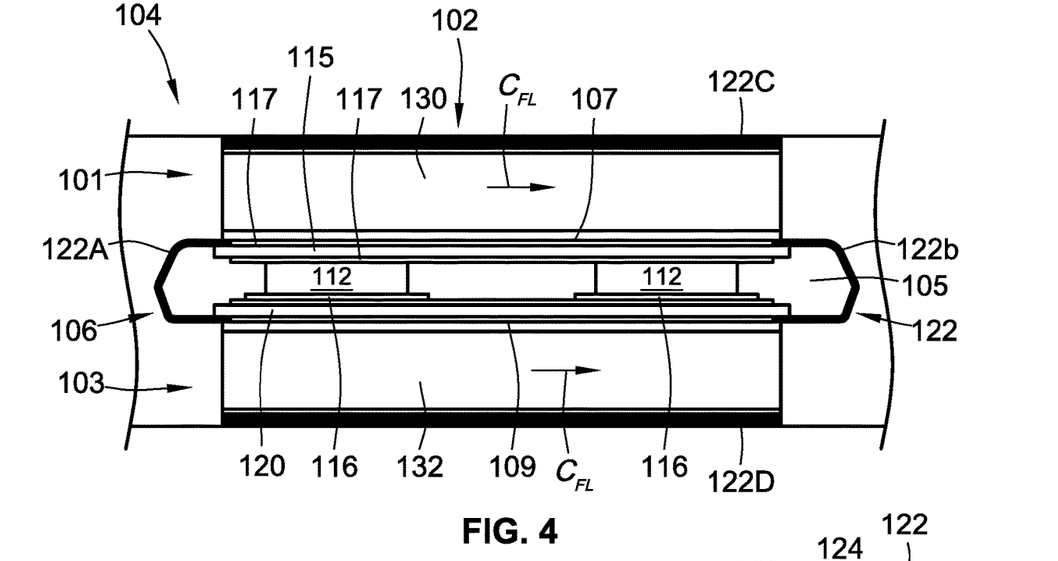
FIG. 4 is an enlarged view of one of the power semiconductor modules in the longitudinal cross-section of the representative TPIM power module package of FIG. 3.

Mounted onto opposing top and bottom sides of the module body 106 is a pair of heat transfer plates 118 and 120 that sandwich therebetween the semiconductor devices 112, 114. These two heat transfer plates 118, 120 are at least partially uncovered by a mold compound 105 of the module body 106 such that a top (first) major surface 107 of the body 106 of the power module 102 is at least partially defined by the top (first) heat transfer plate 118 and a bottom (second) major surface 109 of the body 106 is at least partially defined by the bottom (second) heat transfer plate 120. The heat transfer plates 118, 120 may be made of a metal and/or a ceramic material that exhibits high thermal conductivity (e.g., greater than about 20 W/m·K at ambient temperature) and a low coefficient of thermal expansion (e.g., less than about 10 ppm/K at ambient temperature). As used herein, the term "metal" or "metallic" may refer to elemental metals as well as metal alloys that include a combination of an elemental metal and one or more alloying elements. For instance, each heat transfer plate 118, 120 may be a direct bonded copper (DBC) sandwich structure with a ceramic core 115 (e.g., alumina or aluminum nitride) and copper skins 117 formed on or bonded to opposing upper and lower surfaces of the core 115, as shown in FIG. 4. Alternatively, the heat transfer plates 118, 120 may each be in the form of a direct bonded aluminum (DBA) ceramic substrate with a sheet of copper (Cu) or copper oxide (CuO) sandwiched between and directly bonded to two layers or sheets of aluminum (Al).

In the body 106 of the power module 102, the semiconductor devices 112, 114 are mounted on the substrate 116, electrically coupled to the leads 108, 110, sandwiched between the heat transfer plates 118, 120, and encapsulated in a polymeric mold compound 105. This mold compound 105 (also referred to therein as "polymeric encapsulant") may contain any suitable polymeric material, including epoxy-based, bismaleimide-based, and/or silicone-based polymeric materials. Additional encapsulant options may include thermoset polymers, such as polyurethane, phenolic resins, bismaleimides, polyimides, polyesters, silicones, or other amorphous thermosets, as well as thermoplastic polymers, such as polypropylene, ABS, PVC, PPS, PA, PPA, PAI, PEEK, PE or other semi-crystalline thermoplastics. Also featured in available mold compound compositions are release agents, pigments, silicas, phenolic hardeners, cure-accelerating catalysts, and non-conductive fillers (e.g., minerals, glass, fibers, phosphates, hydroxylates, etc.). Free "outboard" ends of the leads 108, 110 protrude out from the mold compound 105 and through sidewalls of the assembly housing 104. The outermost, exposed surface of the mold compound 105, including the outward-facing surface areas not covered by the plates 118, 120 or occluded by the leads 108, 110, may be modified to increase surface energy, such as by chemical etching or plasma treatment, to improve bonding to a metal or ceramic coating 122, described in further detail hereinbelow.

Figure 3:
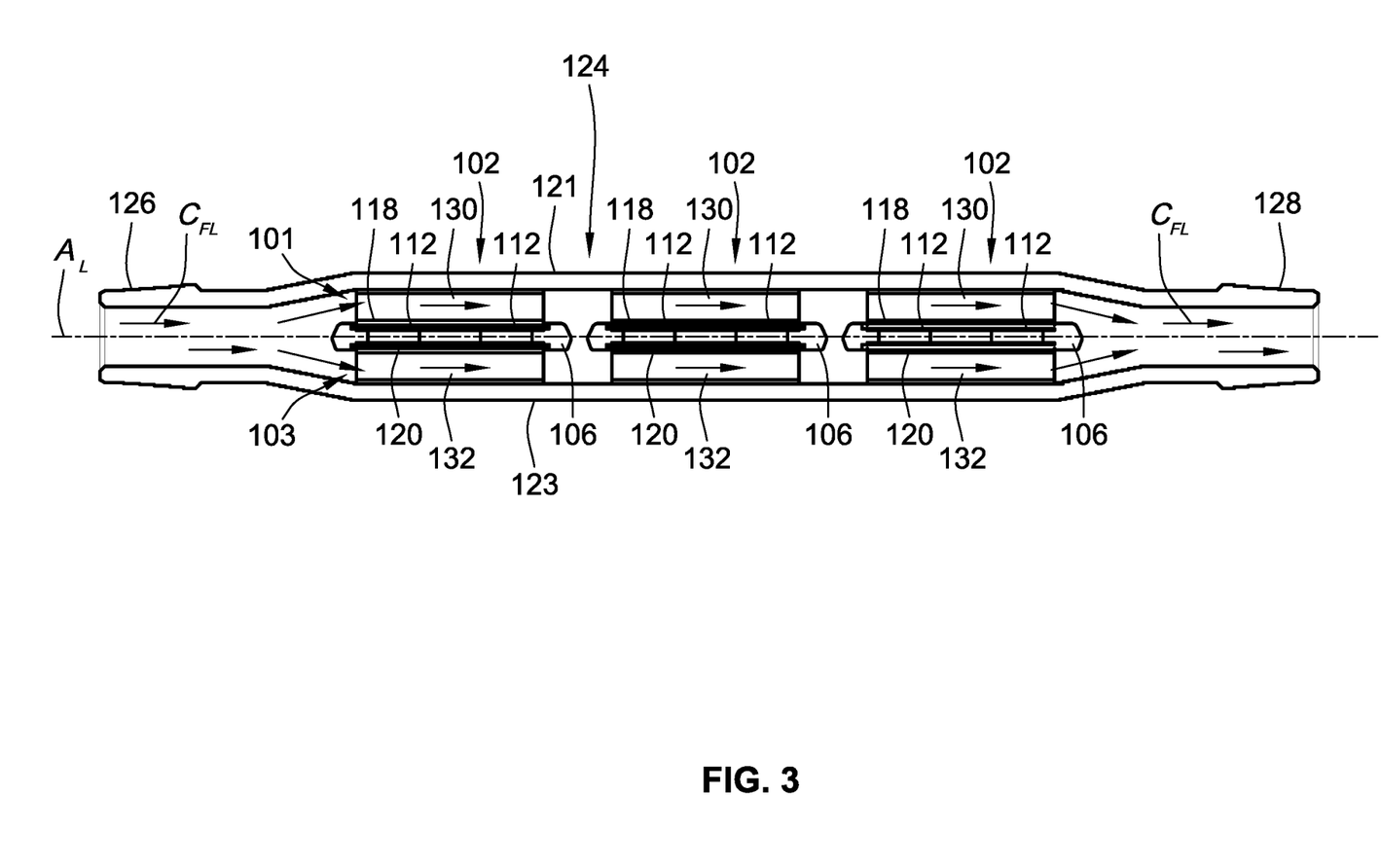
FIG. 3 is longitudinal cross-section of the representative TPIM power module package taken along line 3-3 of FIG. 2.

With collective reference to FIGS. 2 and 3, the assembly housing 104 of the power module package 100 electrically isolates the internal electrical components of the power modules 102 from the surrounding environment and prevents unwanted ingress of dust and moisture. In addition, the assembly housing 104 interfaces with the module body 106 to prevent physical and electrical contact between coolant fluid (represented by arrows $C_{FL}$) flowing through top (first) and bottom (second) coolant fluid channels 101, 103 of the power module package 100 and the exposed free ends of the leads 108, 110. The assembly housing 104 has an elongated, hollow housing body 124 with a central longitudinal axis $A_L$ that delineates a top (half) segment 121 of the body 124 from a bottom (half) segment 123 of the body 124. Located at a proximal (first) end of the housing body 124 is a coolant inlet port 126 that is fluidly connected via fluid channels 101, 103 to a coolant outlet port 128 located at a distal (second) end of the housing body 124 opposite that of the inlet port 126. Both coolant ports 126, 128 are in fluid communication with the two coolant channels 101, 103 such that coolant fluid introduced into the inlet port 126 may be split between the coolant channels 101, 103 and reunited prior to being discharged from the housing's outlet port 128. The designations "top" and "bottom" or "top half" and "bottom half" as used herein with respect to the discussion of the power module package 100 are for reference purposes only as per the orientation shown and could alternatively be interchanged.

The assembly housing 104, including the housing's top and bottom halves 121, 123 and the housing's inlet and outlet ports 126, 128, may be integrally formed as a unitary, one-piece structure. In such case, the entire housing 104 may be formed, e.g., via two-shot injection molding, around the power module 102 to define the internal fluid channels 101, 103 in a single manufacturing step. In other embodiments, the housing 104 may be a multi-part construction formed from numerous discrete components that are positioned around the power modules 102 and then joined to one another along interfaces therebetween. Portions of the housing 104 that directly interface with an exterior surface of a power module 102 may be physically attached thereto during assembly of the power module package 100, for example. An adhesive or sealant may be used to bond the top and bottom halves 121, 123 of the housing 104 to one another and/or to the interfacing exterior surfaces of the power modules 102. Such an adhesive or sealant may be a silicon-based polymeric material, such as epoxy, parylene, or a room-temperature-vulcanizing (RTV) silicone. The assembly housing 104 may be fabricated from a dielectric polymer, which may be a thermosetting or a thermoplastic polymeric material. The housing 104 may be made from an epoxy-and-silica composition or from any of the polymeric materials identified above with respect to the mold compound 105 of the power module body 106. As yet a further option, the housing 104 may be formed with a polyamide, a polyphthalamide, or a Polyphenylene sulfide, any of which may be glass-fiber, silica, and/or mineral filled.

To increase heat transfer from the power modules 102 into the coolant fluid $C_{FL}$, a top (first) and a bottom (second) array of heat transfer fins 130 and 132, respectively, are mounted onto respective top and bottom major surfaces 107, 109 of the power module body 106 and disposed within respective fluid channels 101, 103. A top array of fins 130 is shown physically mounted along a bottom end thereof onto the top major surface 107 of each power module 102 and along a top end thereof to an inside surface of the housing's top half 121. Likewise, a bottom array of fins 132 is physically mounted along a top end thereof to the bottom major surface 109 of each power module 102 and along a bottom end thereof onto an inside surface of the housing's bottom half 123. In the embodiment depicted in FIG. 5, each array of heat transfer fins 130, 132 is defined by a discrete, unitary corrugated metal sheet. In other designs, the heat transfer fins 130, 132 may exhibit alternative configurations, such as a series of discrete pillars, columns, wires, or fins.

The fluid channels 101, 103 direct a flow of coolant fluid $C_{FL}$ (e.g., water, glycol, or both) across and into direct contact with both major surfaces 107, 109 of the power modules 102. At the same time, the flow of coolant fluid $C_{FL}$ is guided through and into direct contact with the waveform surfaces of the fins 130, 132 to effectively and efficiently transfer heat away from the power modules 102 via convection. The top coolant fluid channel 101 extends through the housing 104 in a longitudinal direction parallel to the central longitudinal axis $A_L$ between the top 121 of the housing 104 and the top major surface 107 of the power module 102. In the same vein, the bottom coolant fluid channel 103 extends through the housing 104 in a longitudinal direction parallel to the longitudinal axis $A_L$ of the housing 104 between the bottom 123 of the housing 14 and the bottom major surface 109 of the modules 102.

To greatly minimize the ingress of moisture into the individual power modules 102, a moisture-impermeable metallic and/or ceramic layer 122 may be added onto select sections of the polymeric encapsulant 105. FIG. 4, for example, shows the metallic/ceramic layer 122 with forward (first) and rearward (second) sections 122A and 122B, respectively, covering fore (upstream) and aft (downstream) faces of the encapsulant 105, and wrapping around from those faces to cover the top and bottom surfaces of the encapsulant 105 exposed by the heat transfer plates 118, 120 and fins 130, 132. In so doing, the forward and rearward sections 122A and 122B collectively define a longitudinal cross-section with two mirrored, U-shaped segments. The non-permeable metallic/ceramic layer 122 is also shown with mutually parallel, substantially parallel top (third) and bottom (fourth) sections 122C and 122D, respectively, that are interposed between and physically attaching the top and bottom ends of the fins 130, 132 to the interior surfaces of the housing's top and bottom halves 121, 123. In so doing, the top and bottom sections 122C, 122D collectively define a longitudinal cross-section with two mirrored, rectilinear segments. The non-permeable metallic/ceramic layer 122, however, does not obstruct the fluid channels 101, 103 or the flow of coolant fluid $C_{FL}$ passing through the fins 130, 132. The encapsulant-coating layer 122 may only cover select portions of the power modules 102 that are submerged in the coolant fluid $C_{FL}$, e.g., to ensure that moisture is able to exit each module 102 through non-coated faces.

Continuing with the discussion of the metallic/ceramic layer 122, FIG. 5 shows port (fifth) and starboard (second) side sections 122E and 122F, respectively, covering left-hand and right-hand faces of the fins 130, 132 and wrapping around from those faces to cover the top and bottom transversely projecting surfaces of the encapsulant 105. In so doing, the top and bottom sections 122C and 122D of the non-permeable metallic/ceramic layer 122 cooperate with the side sections 122E and 122F to define a transverse cross-section with two mirrored, omega (Ω)-shaped segments. The non-permeable layer 122, however, does not contact the leads 108, 110 nor cover (i.e., exposes) outboard-facing surfaces of the encapsulant 105 immediately adjacent the leads 108, 110. As shown, the non-permeable metallic/ceramic layer 122 is set back from the leads 108, 110 by at least about 1 mm or, in at least some desired applications, a gap distance of approximately 2-4 mm, e.g., to preclude a short circuit or electrical interference with the leads 108, 110.

For at least some embodiments, the non-permeable metallic/ceramic layer 122, including all six of the above-enumerates sections 122A-122F, may be formed as a unitary, single-piece structure. Alternatively, any one or more or all of the above-enumerates sections 122A-122F may be formed as discrete or coterminous sections. Moreover, the metallic/ceramic layer 122 may include greater or fewer sections that are located at the same or different sections to that which are shown in FIGS. 4 and 5. For instance, the top and bottom sections 122C, 122D may be altogether eliminated from the non-permeable metallic/ceramic layer 122, e.g., such that the fins 130, 132 are bonded directly to the assembly housing 104. As another option, the side sections 122E and 122F may expose the left-hand and right-hand faces of the fins 130, 132 and, thus, only cover the top and bottom transversely projecting surfaces of the encapsulant 105, e.g., to minimize assembly mass and cost.

As shown in FIGS. 4 and 5, one or more metallic and/or ceramic layers may be coated onto exposed, exterior surfaces of the polymeric encapsulant 105, e.g., via thermal spray techniques, electroplating, electroless plating, anodizing, laser cladding, physical vapor deposition, chemical vapor deposition, etc. The inset view of FIG. 5, for example, shows the non-permeable layer 122 with a primary (first) metallic layer 125 abutting, adjoining, and mounted directly onto an exposed surface area of the exterior surface of the polymeric encapsulant 105. An optional, supplemental (second) layer 127 may be applied onto and cover some or all of the primary metallic layer 125. Likewise, an auxiliary (third) layer 129 may be applied onto and cover some or all of the supplemental layer 127. It should be appreciated that the non-permeable metallic/ceramic layer 122 may consist essentially of a single layer or may include two or more layers. For multilayer configurations, all layers may cover the same locations and, thus, share a common total surface area; alternatively, an individual layer may have a distinct layout and a distinct surface area.

Multi-metal coatings may be typified by a non-permeable layer 122 with a primary metallic layer 125 that is formed, in whole or in part, from a first metallic material, and a supplemental layer 127 that is formed, in whole or in part, from a second metallic material distinct from the first metallic material. In a non-limiting example, the primary metallic layer 125 is formed from zinc and the supplemental layer 127 is formed from steel. The auxiliary layer 129 may be formed, in whole or in part, from a third metallic material that is the same as or distinct from the first and/or second metallic materials. Any one or more or all of the layers 125, 127, 129 may be formed from other metallic materials, including aluminum, copper, tin, other ferrous metals, or alloys of any of the herein-described metallic materials. Optionally, the first layer 125 may be a metal-to-plastic adhesive for bonding the second (metallic) layer 127 to the polymeric encapsulant 105, or the second layer 127 may be a metal-to-metal adhesive for bonding the third (metallic) layer 129 to the first (metallic) layer 125.

Rather than an all-metal construction, the non-permeable layer 122 may include supplemental and/or auxiliary layers 127, 129 formed with a ceramic material or a polymeric material. For instance, the supplemental layer 127 or the auxiliary layer 129 may be formed, in whole or in part, from a hydrophobic polymer, such as a urethane-based or silane-based seal coat. As a further option, one or both of the optional layers 127, 129 may be formed from silicates, phosphates, hydroxylates, etc. To increase contact surface area and bonding strength between adjoining metal and polymeric layers, the interfacing surface areas of the exposed exterior surface of the polymeric encapsulant 105 and/or the primary metallic layer 125 may have an etched or roughened finish. In the same vein, contact surface area and bonding strength between adjoining metal layers may be increased by etching/roughening the interfacing surface areas of the exposed exterior surface of the primary layer 125.

As noted above, anti-permeation of moisture into the polymeric encapsulant 105 can be achieved by application of a structurally engineered coating system 122 that alters encapsulant surface properties, such as lowering surface energy and increasing surface roughness, and establishes physical barriers to reduce diffusion coefficients of absorbed molecules. Densification processes, such as thermal impact spraying, powder molding, or laser pinning, may apply intercalated lamellar structures onto the primary metallic layer 125 or the secondary metallic layer 127, e.g., to improve stress and energy-dissipation characteristics. Densification may be achieved using thermal spray techniques, power metallurgy processes, or other suitable metal-densification methods. An exterior surface of a metallic layer, such as primary and/or supplemental metallic layers 125, 127 may be modified to include one or more passivated layer and/or oxidized layers. Oxidated layers may be formed using a chemical reaction between oxygen and a metallic coating layer to optimize its potential difference.

Aspects of the present disclosure have been described in detail with reference to the illustrated embodiments; those skilled in the art will recognize, however, that many modifications may be made thereto without departing from the scope of the present disclosure. The present disclosure is not limited to the precise construction and compositions disclosed herein; any and all modifications, changes, and variations apparent from the foregoing descriptions are within the scope of the disclosure as defined by the appended claims. Moreover, the present concepts expressly include any and all combinations and subcombinations of the preceding elements and features.

What is claimed:

1. A power electronics assembly, comprising:
an assembly housing; and
a power module packaged in the assembly housing and including a substrate, a semiconductor device mounted on the substrate, a polymeric encapsulant encasing therein the substrate and the semiconductor device, an electrical lead connected to the semiconductor device and projecting from the polymeric encapsulant, and a metallic and/or ceramic coating on an exterior surface of the polymeric encapsulant, the metallic and/or ceramic coating including:
a first metallic layer mounted directly onto and covering substantially all of an exposed surface area of the exterior surface of the polymeric encapsulant, and
intercalated lamellar microstructures on an exterior surface of the first metallic layer.

2. The power electronics assembly of claim 1, wherein the metallic and/or ceramic coating further includes a hydrophobic polymer layer covering the exterior surface of the first metallic layer opposite an interior surface thereof adjoining the polymeric encapsulant.

3. The power electronics assembly of claim 2, wherein the exterior surface of the first metallic layer covered by the hydrophobic polymer layer includes an etched or roughened finish.

4. The power electronics assembly of claim 1, wherein the metallic and/or ceramic coating further includes a passivated layer and/or an oxidized layer on the exterior surface of the first metallic layer.

5. The power electronics assembly of claim 1, wherein the metallic and/or ceramic coating further includes a second metallic layer covering the exterior surface of the first metallic layer, the first metallic layer including a first metallic material, and the second metallic layer including a second metallic material distinct from the first metallic material.

6. The power electronics assembly of claim 1, wherein the metallic and/or ceramic coating has a thickness of about 1 micrometer (μm) to about 500 μm.

7. The power electronics assembly of claim 1, wherein the assembly housing includes a first polymeric material and the polymeric encapsulant includes a second polymeric material distinct from the first polymeric material.

8. The power electronics assembly of claim 7, wherein the first polymeric material includes an epoxy with silica, a polyamide, a polyphthalamide, and/or a polyphenylene sulfide, and the second polymeric material includes an epoxy-based, bismaleimide-based, and/or silicone-based mold compound.

9. The power electronics assembly of claim 1, wherein the assembly housing includes an elongated housing body with an inlet port, an outlet port, and a coolant fluid channel fluidly connecting the inlet and outlet ports, the coolant fluid channel extending longitudinally through the elongated housing body between an interior surface of the assembly housing and a major surface of the power module.

10. The power electronics assembly of claim 9, wherein the power module further comprises:
   a thermally conductive heat transfer plate attached to the semiconductor device and defining the major surface of the power module; and
   an array of heat transfer fins mounted onto the major surface of the power module and disposed within the fluid channel.

11. A power electronics assembly comprising:
   an assembly housing; and
   a power module packaged in the assembly housing and including a substrate, a semiconductor device mounted on the substrate, a polymeric encapsulant encasing therein the substrate and the semiconductor device, an electrical lead connected to the semiconductor device and projecting from the polymeric encapsulant, and a metallic and/or ceramic coating on an exterior surface of the polymeric encapsulant, the metallic and/or ceramic coating including:
      a first metallic layer including a first metallic material and covering substantially all of an exposed surface area of the exterior surface of the polymeric encapsulant; and
      a second metallic layer including a second metallic material, distinct from the first metallic material, and covering substantially all of an exposed surface area of an exterior surface of the first metallic layer, wherein the first metallic material includes zinc and the second metallic material includes steel.

12. The power electronics assembly of claim 11, wherein the metallic and/or ceramic coating further includes intercalated lamellar microstructures on the exterior surface of the first metallic layer.

13. A method of manufacturing a power electronics assembly, the method comprising:
   forming an assembly housing;
   assembling a power module including a substrate, a semiconductor device mounted on the substrate, and an electrical lead connected to the semiconductor device;
   encasing the substrate and the semiconductor device in a polymeric encapsulant;
   applying a metallic and/or ceramic coating on an exterior surface of the polymeric encapsulant, the metallic and/or ceramic coating including:
      a first metallic layer mounted directly onto and covering substantially all of an
      exposed surface area of the exterior surface of the polymeric encapsulant, and intercalated lamellar microstructures on an exterior surface of the first metallic layer; and
   locating the power module, with the substrate and the semiconductor device encased in the polymeric encapsulant with the metallic and/or ceramic coating, in the assembly housing.

14. The method of claim 13, wherein the metallic and/or ceramic coating further includes a hydrophobic polymer layer covering the exterior surface of the first metallic layer opposite an interior surface thereof adjoining the polymeric encapsulant.

15. The method of claim 13, wherein the metallic and/or ceramic coating further includes a passivated layer and/or an oxidized layer on the exterior surface of the first metallic layer.

16. The method of claim 13, wherein the metallic and/or ceramic coating further includes a second metallic layer covering the exterior surface of the first metallic layer, the first metallic layer including a first metallic material, and the second metallic layer including a second metallic material distinct from the first metallic material.

17. The method of claim 16, wherein the first metallic material includes zinc and the second metallic material includes steel.

18. The method of claim 13, wherein the metallic and/or ceramic coating has a thickness of about 1 micrometer ($\mu m$) to about 500 $\mu m$.

19. The method of claim 13, wherein the assembly housing includes a first polymeric material and the polymeric encapsulant includes a second polymeric material distinct from the first polymeric material.

20. The method of claim 13, wherein the assembly housing includes a housing body with an inlet port, an outlet port, and a coolant fluid channel fluidly connecting the inlet and outlet ports, the coolant fluid channel extending through the housing body between an interior surface of the assembly housing and a major surface of the power module.

* * * * *